(12) United States Patent
Billiot et al.

(10) Patent No.: US 10,707,850 B2
(45) Date of Patent: Jul. 7, 2020

(54) CALIBRATION OF A DELAY CIRCUIT (71) Applicants: Commissariat à l'Énergie Atomique et aux Énergies Alternatives, Paris (FR); Greenfield Technology, Massy (FR)

(72) Inventors: Gérard Billiot, Grenoble (FR); Franck Badets, Voiron (FR); Dominique Monnier-Bourdin, Le Barp (FR); Bernard Riondet, Vauhallan (FR)

(73) Assignees: Commissariat à l'Énergie Atomique et aux Énergies Alternatives, Paris (FR); Greenfield Technology, Massy (FR)

( * ) Notice: Subject to any disclaimer, the term of this patent is extended or adjusted under 35 U.S.C. 154(b) by 0 days.

(21) Appl. No.: 16/707,881

(22) Filed: Dec. 9, 2019

(65) Prior Publication Data
US 2020/0186135 A1 Jun. 11, 2020

(30) Foreign Application Priority Data

Dec. 11, 2018 (FR) ..................................... 18 72693

(51) Int. Cl.
*H03K 5/135* (2006.01)
*H03K 5/131* (2014.01)
*H03M 1/66* (2006.01)
*H03K 5/00* (2006.01)

(52) U.S. Cl.
CPC ............ *H03K 5/135* (2013.01); *H03K 5/131* (2013.01); *H03M 1/66* (2013.01); *H03K 2005/00058* (2013.01)

(58) Field of Classification Search
CPC combination set(s) only.
See application file for complete search history.

(56) References Cited

U.S. PATENT DOCUMENTS

| 5,719,528 | A | * | 2/1998 | Rasmussen | ........... | H02M 3/158 |
| | | | | | | 330/10 |
| 5,790,480 | A | | 8/1998 | Klatser | | |
| 7,176,819 | B1 | * | 2/2007 | Swerlein | ............... | H03M 3/322 |
| | | | | | | 341/143 |
| 10,003,328 | B1 | * | 6/2018 | Yin | ........................ | H03K 5/156 |
| 10,128,827 | B1 | * | 11/2018 | Quek | ..................... | H03K 5/135 |
| 10,498,352 | B1 | * | 12/2019 | Caffee | ................... | H03M 1/806 |
| 2003/0151453 | A1 | * | 8/2003 | Laletin | ................. | H03K 5/1565 |
| | | | | | | 327/551 |
| 2004/0051656 | A1 | * | 3/2004 | Pavicic | .............. | H03M 1/1215 |
| | | | | | | 341/155 |
| 2005/0024249 | A1 | * | 2/2005 | Pavicic | ................. | H03M 1/127 |
| | | | | | | 341/155 |
| 2007/0229038 | A1 | * | 10/2007 | Lin | ........................ | H03F 3/005 |
| | | | | | | 320/166 |

(Continued)

FOREIGN PATENT DOCUMENTS

JP H04-215314 A1 8/1992

OTHER PUBLICATIONS

Preliminary Search Report for French Application No. 1872693, dated Aug. 30, 2019.

*Primary Examiner* — Adam D Houston
(74) *Attorney, Agent, or Firm* — Wolf, Greenfield & Sacks, P.C.

(57) ABSTRACT

A method of calibrating a delay generation circuit and the corresponding circuit.

11 Claims, 6 Drawing Sheets

(56) References Cited

U.S. PATENT DOCUMENTS

| | | | | |
|---|---|---|---|---|
| 2010/0134083 | A1* | 6/2010 | Trescases | G04F 10/005 |
| | | | | 323/283 |
| 2011/0285568 | A1* | 11/2011 | Harpe | H03M 1/56 |
| | | | | 341/158 |
| 2014/0066886 | A1* | 3/2014 | Roy | A61B 5/14532 |
| | | | | 604/504 |
| 2014/0066888 | A1* | 3/2014 | Parikh | A61M 5/1723 |
| | | | | 604/504 |
| 2015/0035576 | A1* | 2/2015 | Romano | H03K 5/131 |
| | | | | 327/262 |
| 2015/0054555 | A1* | 2/2015 | Berkram | H03L 7/0812 |
| | | | | 327/158 |
| 2015/0355037 | A1* | 12/2015 | Cottin | G01K 7/32 |
| | | | | 374/1 |
| 2016/0373120 | A1 | 12/2016 | Caffee et al. | |
| 2017/0194950 | A1* | 7/2017 | Hernes | G06F 1/06 |
| 2018/0048232 | A1* | 2/2018 | Adell | H02M 3/1563 |
| 2018/0138911 | A1* | 5/2018 | Kuo | H03L 1/00 |
| 2018/0269895 | A1 | 9/2018 | Kim | |
| 2019/0229710 | A1* | 7/2019 | Dedic | H03K 5/01 |
| 2020/0089630 | A1* | 3/2020 | Yamamoto | G06F 13/1689 |

\* cited by examiner

CALIBRATION OF A DELAY CIRCUIT

This application claims the priority benefit of French patent application number 18/72693, filed on Dec. 11, 2018, the content of which is hereby incorporated by reference in its entirety to the maximum extent allowable by law.

TECHNICAL BACKGROUND

The present disclosure generally concerns electronic circuits and, more specifically, programmable circuits for generating asynchronous delays. The present disclosure more particularly concerns circuits based on ramp generators.

PRIOR ART

In many applications, it is desired to have elements for delaying electronic signals. These may for example be phase comparators, synchronization functions, clock signal generators, transmission circuits, etc. Most often, it is also desired to be able to program the delay, that is, to adjust its value. Further, it is also generally desirable to be able to guarantee the relation between a set point delivered by the application and the value of the obtained delay.

Programmable delay generation functions generally deliver a pulse after a given time period following a trigger event. This time period defines the value of the delay. The programming of the delay (set point) may take various analog or digital forms.

Programmable delay functions or circuits may be distributed into three large categories.

A first category concerns solutions based on digital counters incremented at the rate of an oscillator. The trigger event is generally an initialization of the counter. The delay pulse is triggered when the counter reaches a given count representing the set point.

A second category concerns solutions based on delay elements (most often logic inverters) assembled as a delay locked loop (DLL).

A third category concerns solutions based on a generator of voltage ramp from a capacitor charge. In such solutions, a voltage ramp is obtained by the charge of a capacitor at constant current and the delay pulse is generated when the voltage of the ramp reaches a threshold representing the set point.

The present disclosure more particularly concerns this third category of delay elements.

Document US-A-2016/0373120 describes a digital-to-time converter calibration technique.

Document JP-A-04215314 describes a variable delay circuit.

Document U.S. Pat. No. 5,790,480 describes a circuit for measuring the time between two events.

Document US-A-2018/0269895 describes a digital-to-time converter and its operating method.

SUMMARY

There is a need to improve electronic delay elements in terms of reliability of the relation between a set point of a desired delay and the obtained delay value.

There also is a need to improve electronic delay elements in terms of resolution (interval between two consecutive values of the delay).

An embodiment overcomes all or part of the disadvantages of usual delay circuits.

An embodiment provides a method of calibrating a delay generation circuit, the circuit comprising:
a first capacitive element of integration of a first current supplied by a first current source, wherein the first current source comprises a first digital-to-analog converter controlled by a first digital control code;
a circuit of initialization of the capacitive element on order of an initialization signal;
a comparator of a first charge voltage of said capacitive element with respect to a second voltage, said second voltage being generated from a second digital-to-analog converter controlled by a second digital control code, the comparator having a comparison output delivering an output signal having a desired delay with respect to the initialization signal; and wherein, during a phase of use of the delay generation circuit, only one code, called selection code, among the first and second digital control codes, is used to select the desired delay, the other control code, called adjustment code, remaining at a predefined value; and wherein, during a phase of calibration of the delay generation circuit, the first and second digital control codes are used to defined said predefined value and the comparison output is coupled to an input of a phase comparator; and wherein the calibration method comprises the steps of:
in a first test phase:
a1) applying a first set of first and second digital control codes and applying an initialization signal;
b1) delivering, on another input of the phase comparator, a calibration signal having a first reference delay with respect to the initialization signal;
c1) analyzing the output signal of the phase comparator; and
in a second test phase:
a2) applying a second set of first and second digital control codes and applying an initialization signal;
b2) delivering, on said other input of the comparator, a calibration signal having a delay equal to the sum of the first reference delay and of a second reference delay;
c2) analyzing the output signal of the phase comparator.

According to an embodiment, the first and second test phases are repeated a plurality of times by changing the first and second sets of first and second digital control codes, to identify said predefined value of the adjustment code.

According to an embodiment, the first test phase is repeated by changing the value of a same code from among the selection code and the adjustment code, and the second test phase is repeated by changing the value of the other code.

According to an embodiment, a same test phase, the first and/or the second one, is repeated a plurality of times for a same set of digital control codes, the successive values of the output comparison signal being analyzed together to determine whether the applied set of digital codes enables or not to obtain a delay substantially equal, according to the test phase, to the first reference delay or to the sum of the first and second reference delays.

According to an embodiment, during the test phase, optionally repeated by changing the value of the selection code, a first limiting value of the selection code is searched and a second limiting value of the selection code is defined from the first limiting value and from a number of codes corresponding to a desired full swing code range; and, during the other test phase, optionally repeated by changing the value of the adjustment code, the value of the selection code used corresponds to the previously-defined second limiting value of the selection code.

According to an embodiment, the second reference delay corresponds to a desired full swing delay range for which the curve representing the delay obtained according to the selection code value, for a given adjustment code value, is substantially linear.

According to an embodiment, the method uses a second delay generation circuit identical to said delay generation circuit, wherein, during steps b1) and b2), the second delay generation circuit is used to generate said calibration signal at the input of the comparator, the initialization signal of the second delay generation circuit being respectively synchronous with the initialization signal of the first delay generation circuit or delayed by a delay equal to the second reference delay.

An embodiment provides a circuit comprising a delay generation circuit, comprising:
- a capacitive element of integration of a first current supplied by a first current source, wherein the first current source comprises a first digital-to-analog converter controlled by a first digital control code;
- a circuit of initialization of the capacitive element on order of an initialization signal;
- a comparator of a first charge voltage of said capacitive element with respect to a second voltage, said second voltage being generated from a second digital-to-analog converter controlled by a second digital control code, the comparator having a comparison output delivering an output signal having a desired delay with respect to the initialization signal; and wherein, during a phase of use of the delay generation circuit, only one code, called selection code, among the first and second digital control codes is used to select the desired delay, the other control code, called adjustment code, remaining at a predefined value; and wherein, during a phase of calibration of the delay generation circuit, the first and second digital control codes, as well as the initialization signal, are controlled by a calibration device, and the output signal is received by the calibration device, to define said predefined value of the adjustment code by implementing a calibration method.

According to an embodiment, the circuit comprises a delay calibration circuit coupled to the delay generation circuit, the calibration circuit comprising a phase comparator receiving on an input said output signal of the delay generation circuit and on another input a calibration signal, the calibration circuit implementing, in a calibration phase prior to the phase of use, the calibration method.

According to an embodiment, the second reference delay corresponds to a period of a reference clock signal, optionally generated by a clock generation device of the circuit.

According to an embodiment, the circuit comprises a plurality of identical delay generation circuits, a second delay generation circuit being used to implement the calibration method on a first delay generation circuit, by implementing the calibration method using a second delay generation circuit identical to said delay generation circuit, wherein, during steps b1) and b2), the second delay generation circuit is used to generate said calibration signal at the input of the comparator, the initialization signal of the second delay generation circuit being respectively synchronous with the initialization signal of the first delay generation circuit or delayed by a delay equal to the second reference delay.

The foregoing and other features and advantages will be discussed in detail in the following non-limiting description of specific embodiments in connection with the accompanying drawings.

BRIEF DESCRIPTION OF THE DRAWINGS

FIG. 2 shows, in views FIG. 2A, FIG. 2B, and FIG. 2C (FIGS. 2A, 2B, 2C), timing diagrams illustrating the operation of a ramp delay element of the type described in relation with FIG. 1;

FIG. 5 very schematically illustrates in the form of timing diagrams, in views FIG. 5A and FIG. 5B (FIGS. 5A, 5B), certain parameters conditioning the operation of a delay generator;

FIG. 7 illustrates, in views FIG. 7A and FIG. 7B (FIGS. 7A, 7B), respectively a first and a second phase of an example of a method of searching for a code and values shown in FIG. 5B.

DESCRIPTION OF THE EMBODIMENTS

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the destination of the generated delays has not been detailed, the embodiments being compatible with usual destinations of delay signals which depend on the application, the described embodiments being in particular compatible with usual applications of delay elements. Further, the generation of the signals or events triggering the delays generated by the delay circuits of the described embodiments has not been detailed, the described embodiments being compatible with usual techniques of generation of trigger signals which depend on the application.

Throughout the present disclosure, the term "connected" is used to designate a direct electrical connection between circuit elements, whereas the term "coupled" is used to designate an electrical connection between circuit elements that may be direct, or may be via one or more intermediate elements.

The terms "approximately", "about", and "in the order of" are used herein to designate a tolerance of plus or minus 10%, preferably of plus or minus 5%, of the value in question.

Figure 1:
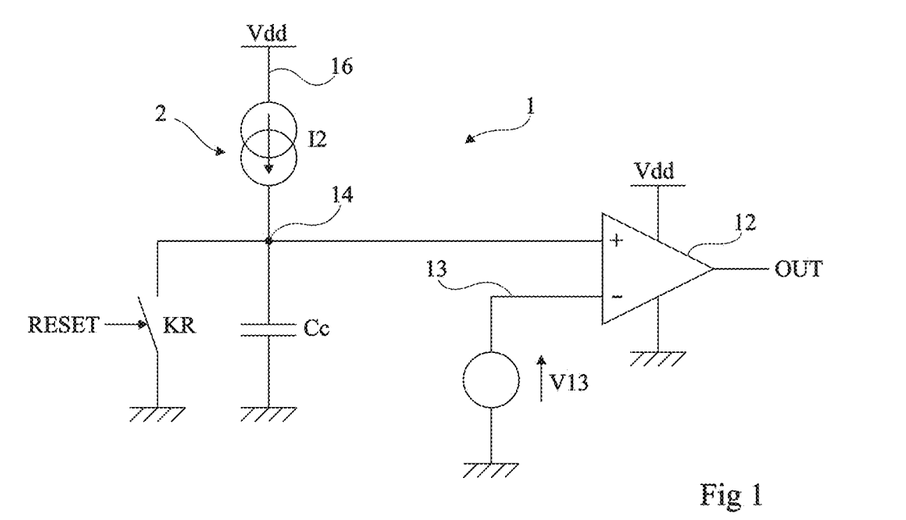
FIG. 1 is a very simplified representation of an example of a ramp delay element of the type to which embodiments which will be described apply.

FIG. 1 is a very simplified representation of an example of a ramp delay element of the type to which embodiments which will be described apply.

The circuit comprises a comparator 12 having an input 13 (for example, inverting (−)) receiving a reference or set point voltage V13 and having its other input 14 (for example, non-inverting (+)) coupled, preferably connected, to a first electrode of a capacitor Cc having its other electrode coupled, preferably connected, to ground. Capacitor Cc is intended to be charged by a source 2 of a constant current I2 powered with a DC voltage Vdd. Current source 2 couples a terminal 16 of application of voltage Vdd to node 14. Further, node 14 is coupled to ground by a reset switch KR. Switch KR is in parallel with capacitor Cc and enables to discharge it each time switch KR is turned on. In other words, a turning off of switch KR triggers the delay or the initialization of the delay. After each turning off of switch KR, the potential of node 14 increases under the effect of the charge of potential Cc by current I2 supplied by source 2. As soon as the potential reaches the threshold corresponding to voltage V13, output OUT switches.

Figure 2A:
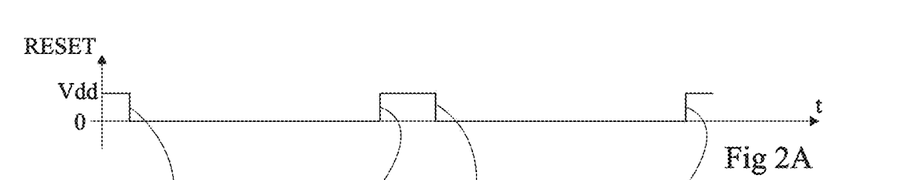
Figure 2B:
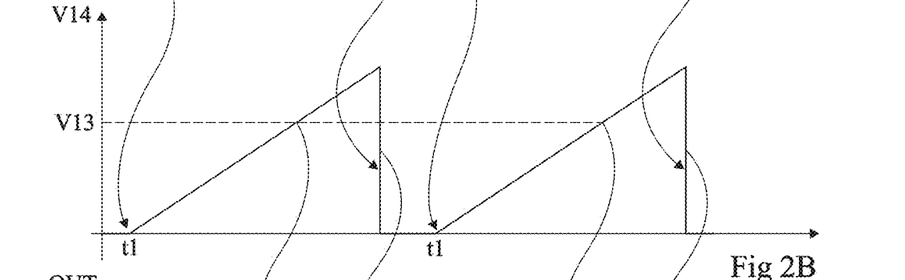
Figure 2C:
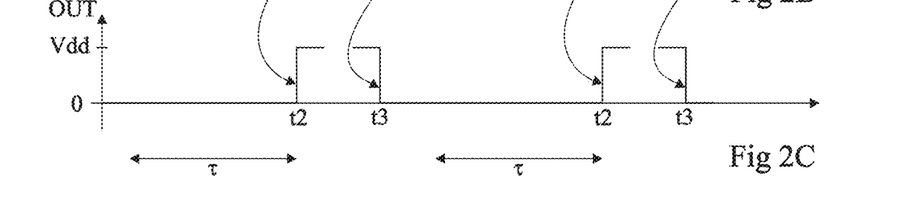

FIGS. 2A, 2B, and 2C are timing diagrams illustrating the operation of a ramp delay element of the type described in relation with FIG. 1.

FIG. 2A illustrates an example of shape of signal RESET for controlling switch KR. FIG. 2B illustrates a corresponding example of the variation of voltage V14 across capacitor Cc. FIG. 2C illustrates the corresponding shape of signal OUT. Signals RESET and OUT are signals in all or nothing (0 or 1) while signal V14 is a voltage ramp.

At each time t1 when switch KR is turned off (FIG. 2A), a cycle of charge of capacitor Cc via current source 2 starts. Voltage V14 (FIG. 2B) starts increasing and, when (time t2) voltage V14 reaches threshold V13, the output OUT (FIG. 2C) of comparator 12 switches (in the present example, to the high state). Voltage V14 starts increasing after time t2, possibly until the saturation, as long as the discharge of capacitor Cc is not caused by the turning on of switch KR. As soon as the time (t3) when signal RESET switches back (arbitrarily) to the high state to turn on switch KR, capacitor Cc is discharged, and a new cycle can be resumed.

The high and low levels of signal OUT are linked to the power supply voltage of comparator 12 and are arbitrarily noted as being Vdd and zero (ground), neglecting, in particular, voltage drops in the conductive transistors of comparator 12. Similarly, a signal RESET respectively having Vdd and ground as its high and low states is arbitrarily considered.

Delay □ (interval between times t1 and t2) may be programmed by controlling the slope of the ramp, that is, the charge current or the capacitance of capacitor Cc, the reference voltage V13 of comparator 12, or the initial charge of capacitor Cc.

An analog ramp generation solution such as illustrated in FIG. 1 is often preferred to purely digital solutions of the two other categories (with a counter or with logic delay elements) because of its linearity. Indeed, provided for the charge of capacitor Cc to effectively occur under a constant current the analog ramp presented at non-inverting input 14 of comparator 12 is effectively linear.

However, the set point of the desired delay value is often digital and the charge current I2 of capacitor Cc, or reference voltage V13, is then supplied by a digital-to-analog converter.

To have a reliable generator, the relation between the digital code supplied to the digital-to-analog converter and the obtained delay value also has to be reliable. Now, many parameters such as, among others, technological dispersions between components, power supply voltage differences, etc., may have an influence on the code-delay relation. In particular, to be able to reliably use a delay generator, it is desired to be able to calibrate the generator, particularly in terms of code range providing a linear variation of the delay.

Figure 3:
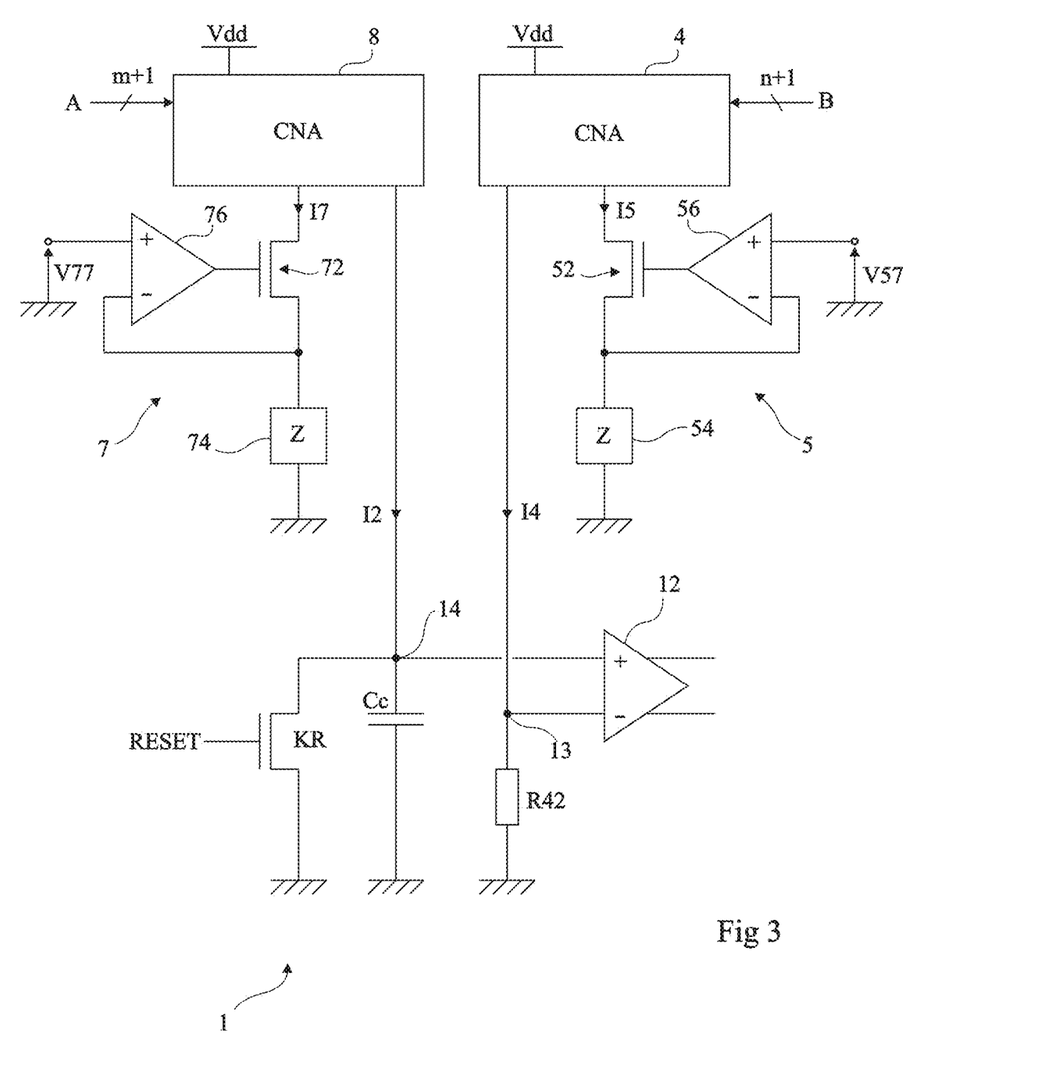
FIG. 3 very schematically shows in the form of blocks an embodiment of a delay generator.

FIG. 3 very schematically shows in the form of blocks an embodiment of a delay generator.

According to this embodiment, both the charge current I2 of ramp generation capacitor Cc and the voltage V13 setting the time of switching of the output of comparator 12, and thus the delay, are generated by digital-to-analog converters (DAC).

Thus, node 14 is coupled, preferably connected, to the analog output of a digital-to-analog converter 8. Converter 8 coverts a binary word A of m+1 (for example, in the range from eight to sixteen) bits A0, . . . , Am into a current I2. Converter 8 is powered with voltage Vdd and uses a reference current I7 to generate current I2. The value of current I2 is a function of digital set point A and of current I7.

On the reference side of compactor 12 (here having differential outputs), node 13, corresponding to the inverting input (−) of comparator 12, is coupled, preferably connected, to a first terminal of a resistor R42 having its other terminal coupled, preferably connected, to ground. A digital-to-analog converter 4 converts a binary word B of n+1 (for example, in the range from eight to sixteen) bits B0, . . . , Bn into a current I4. The output of converter 4, delivering current I4, is coupled, preferably connected, to node 13. Converter 4 is powered with voltage Vdd and uses a reference current I5 to generate current I4.

Reference currents I5 and I7 are for example generated from current sources 5 and 7 based on a conversion of constant reference voltages, respectively V57 and V77. In the example shown in FIG. 3, each current source 5, respectively 7, is based on a MOS transistor 52, respectively 72, in series with a resistive impedance 54, respectively 74. Resistive impedances 54 (value R54) and 74 (value R74) are, for example, resistors or circuits defining resistances (for example, switched-capacitor circuits). Each transistor 52, 72 is controlled by a follower assembly comprising an operational amplifier 56, respectively 76, having a non-inverting input (+) receiving constant reference voltage V57, respectively V77, and having an inverting input (−) connected between transistor 52, respectively 72, and resistor 54, respectively 74.

Figure 4:
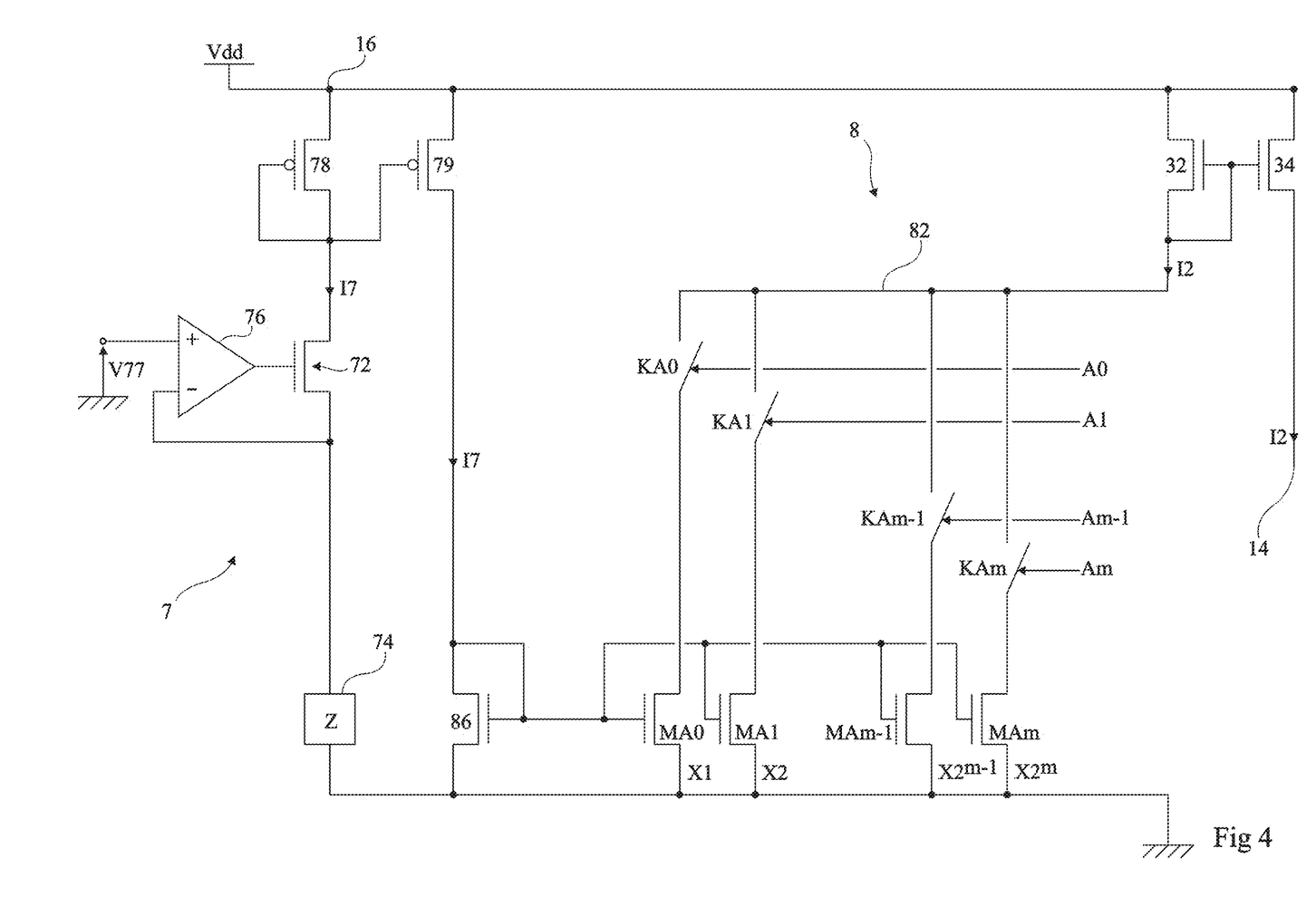
FIG. 4 schematically shows an embodiment of a digital-to-analog converter.

FIG. 4 schematically shows an embodiment of a digital-to-analog converter 8 and a mode of relation between current source 7 and current I2.

The embodiment of converter 8 and of current source 7 is arbitrarily taken as an example, but the following description of FIG. 4 transposes to a description of converter 4 and of current source 5 by simple transposition of the numerical references.

Current I2 corresponds to the sum of the currents in the m+1 branches in parallel of converter 8, which are individually controlled by one of the bits Aj (j in the range from 0 to m) of word A. Each branch comprises, between a node 82 and ground, a switch KA0, KA1, . . . , KAm−1, KAm, and a transistor MOS MA0, MA1, . . . , MAm−1, MAm. It is generally preferred to generate current I2 of converter 8 with respect to a ground reference and then to copy the current to inject it into capacitor Cc. Thus, a transistor 32 (for example, MOS) couples node 82 to terminal 16 of application of voltage Vdd. The gate and the drain of transistor 32 are interconnected. A transistor 34, of the same type as transistor 32, is mirror-assembled on transistor 32 with its source coupled, preferably connected, to terminal 16. The gate of transistor 34 is connected to the gate of transistor 32 and its drain coupled, preferably connected, to node 14. With transistors 32 and 34 having identical surface area ratios, the current flowing through transistor 34 is equal to the current I2 flowing through transistor 32.

On the side of current I7, transistors MAj are current mirror assembled on a transistor 86 having the current I7 delivered by constant current source 7 flowing therethrough.

Thus, the drain and the gate of transistor 86 are interconnected and its source is coupled, preferably connected, to ground. The gates of transistors MAj are connected to the gate of transistor 86. Further, the surface area ratios of transistors MAj are doubled with rank j. In other words, considering a transistor MA0 having a normalized surface area ratio 1 ($2^0$), transistor MA1 has a surface area ratio 2 (i.e. $2^1$), a transistor MAj has a surface area ratio $2^j$, transistor MAm−1 has a surface area ratio $2^{m-1}$, and transistor MAm has a surface area ratio $2^m$. Thus, current I2 can be written as:

$$I2 = I7 \times \sum_{j=0}^{m}(Aj \times 2^j)$$

In the example of FIG. 4, where current source 7 is assumed to be that shown in FIG. 3, current I7 is supplied to transistor 86, here again, by a current mirror assembly. Thus, for example, a transistor 78 (for example, PMOS) is placed between transistor 72 (its drain) and terminal 16 of application of voltage Vdd. A transistor 79, of the same type as transistor 78, is assembled as a current mirror on transistor 78 with its source coupled, preferably connected, to terminal 16, its gate connected to the gate of transistor 78, and its drain coupled, preferably connected, to the drain of transistor 86. With transistors 78 and 79 having identical surface area ratios, the current flowing through transistor 79, and thus through transistor 86, is equal to the current I7 flowing through transistor 72.

Advantage is provided to be taken of an architecture of a delay circuit with digital-to-analog converters of the type described in relation with the previous drawings to calibrate one or a plurality of programmable delay generation paths in an electronic circuit.

Figure 5A:
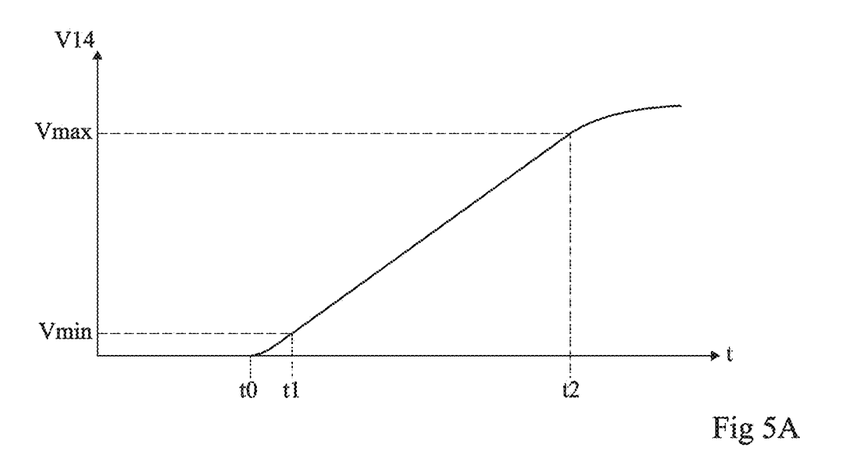

FIG. 5A shows an occurrence of a voltage ramp at node 14. The shape of FIG. 5A illustrates the fact that voltage ramp V14 is not linear over its entire range, but suffers from a lack of linearity at the beginning and/or at the end. For example between a time t0 when switch KR is off and a time t1, the variation of voltage V14 is not linear. Further, if too high a reference voltage V13 is selected, a saturation phenomenon occurs (from a time t2) and the linear shape of the slope is lost. Thus, the voltage range V14 where the variation is linear and allows a correct control by a digital word B is between times t1 and t2.

"Limiting" minimum and maximum values Vmin and Vmax of voltage V14 defining this linear variation range can be defined for a digital control delay generator. Then, a low limiting value V(B(s)) and a high limiting value V(B(e)), which correspond to digital control words B(s) and B(e), and a minimum delay T(s) and a maximum delay T(e) such that the number of digital control words equal to B(e)−B(s) corresponds to a predefined range of delays called full swing voltage FSV, will be searched for between the limiting values. It should be noted that the curve shown in FIG. 5B corresponds to a control value A. In practice, the FSV delay range is selected so that it corresponds to a linear variation whatever the control value A.

A difficulty lies in the fact that the operation of a delay circuit and its linearity range may vary, among others, under the effect of technological manufacturing dispersions. Further, one may also observe drifts in the operation due to aging or to other factors.

The fact of providing the generation of currents I2 and I4 by means of digital-to-analog converters makes it possible to calibrate the delay generation circuit. Once the circuit has been calibrated, only control signal B is used to control the desired delay value, while control signal A is fixed.

Thus, value T of the delay is set by the value of voltage V13 which is determined by digital word B. Indeed, voltage V13 is:

$$V13 = R42 \times I4$$

And current I4 can be expressed as:

$$I4 = I5 \times \sum_{i=0}^{n}(Bi \times 2^i)$$

Accordingly, voltage V13 can be written as:

$$V13 = \frac{R42 \times V57}{R54} \times \sum_{i=0}^{n}(Bi \times 2^i)$$

At the time when comparator 12 switches (delay T), voltage V14 can be expressed as:

$$V14 = \frac{I2}{Cc} \times T$$

Now, current I2 can be written as:

$$I2 = \frac{V77}{R74} \times \sum_{j=0}^{m}(Aj \times 2^j)$$

Accordingly, delay T can be expressed as:

$$T = \frac{R42}{R54} \times Cc \times R74 \times \frac{\sum_{i=0}^{n}(Bi \times 2^i)}{\sum_{j=0}^{m}(Aj \times 2^j)}$$

Assuming that voltages V77 and V57 are identical (and correspond to a reference voltage, preferably identical), delay T can be expressed as:

$$T = \frac{R42}{R54} \times Cc \times R74 \times \frac{\sum_{i=0}^{n}(Bi \times 2^i)}{\sum_{j=0}^{m}(Aj \times 2^j)}$$

It can thus be seen that with a circuit of the type shown in FIG. 3, it is possible to compensate for possible technological manufacturing dispersions, particularly having an influence on the values of components R54, R74, R42, and Cc, by setting the value of word A so that the delay circuit delivers a reliable delay value according to the value of word B.

According to a simplified embodiment, it is provided, in a calibration phase, for example, during tests at the end of the manufacturing of the electronic circuit integrating the programmable delay element, to empirically determine code A to be set in order to obtain the desired dynamic range (possible reliable delay range).

Preferably, the calibration is however performed from a reference delay element.

In an embodiment, advantage is taken from the fact that an electronic circuit integrating programmable delay elements generally comprises, rather than a single delay element, most often a plurality of (at least two) delay generation paths, all based on identical structures. It is then possible, in a calibration phase, to calibrate one or a plurality of paths, using another path as a reference.

According to an embodiment, a reference path, for example, a path which has been empirically calibrated, is defined once and for all, and the reference path is used to calibrate the other delay paths.

However, as will be seen hereafter, one may also, in a preferred embodiment, use any first path, even non-calibrated, as a reference path to calibrate one or a plurality of paths, the first path being then for example itself calibrated by means of any of the other paths.

Figure 6:
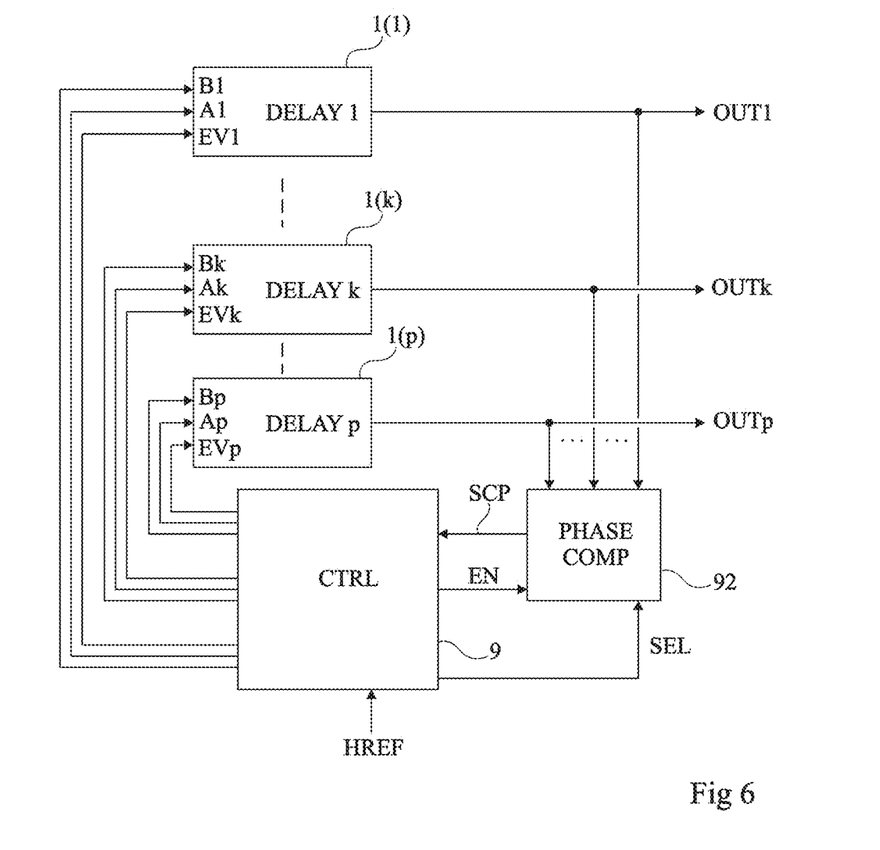
FIG. 6 very schematically illustrates in the form of blocks an example of an electronic circuit architecture comprising a plurality of paths, each comprising a programmable delay circuit.

FIG. 6 very schematically shows in the form of blocks an example of an electronic circuit architecture comprising a plurality (p) of paths k (k in the range from 1 to p) each comprising a programmable delay circuit 1(k) (DELAY k) such as described hereabove.

The number p of paths k depends on the application and on the number of different delays to be generated in the electronic circuit.

Each path k comprises a programmable circuit 1(k) such as illustrated in FIG. 3. Each circuit 1(k) delivers, on an output OUTk, the expected delay, that is, a pulse delayed by a duration Tk with respect to the occurrence of a trigger signal (here noted EVk). In practice, signal EVk may be coupled to the reset signal RESET of the previously-described generator.

The delay Tk(B) generated by a path k for a given value of Bk can be written as:

$$Tk(Bk)=Tk(0)+Bk\cdot Pk(Ak)$$

where:

Tk(0) is the minimum or intrinsic delay of the path for Bk=0; and

Pk(Ak) represents the coefficient of the slope of the delay, which, here, is programmable by value Ak.

Since this delay actually depends on value Ak, the delay Tk introduced by path k will be noted hereafter with the two arguments or codes Bk and Ak, that is, Tk(Bk, Ak).

To describe the operation of the calibration process, it is arbitrarily assumed, in the example of FIG. 6, that a path identified as "c" (k=c) is calibrated from a reference path identified as "r" (k=r). As previously indicated, the selection of the reference path for the calibration of a given path of the circuit of FIG. 6 is of no importance.

For each calibration, the following values may be defined:

Bc(e): the final or maximum value of the code B of the path to be calibrated;

Bc(s): the initial or minimum value of the code B of the path to be calibrated;

Br(s): the initial or minimum value of the code B of the reference path;

Ts: a reference minimum delay value;

Tref: a reference delay value corresponding to the desired full swing delay range FSD;

Ar: the value of code A defining the conversion gain of the slope of the reference path.

To calibrate path c, it is desired to determine code Ac (representing the gain of the charge ramp of capacitive element Cc) and the initial value Bc(s) enabling to provide a full swing delay range (FSD), that is, a linear variation of delay Tc of path c over the entire range of codes Bc(s) to Bc(e) and such that the amplitude of the delay range between these codes, corresponding to the full swing delay range FSD, is equal to a predefined reference delay Tref.

In other words, for calibration purposes, the searched Bc(s) and Ac code values substantially verify the following equation 0:

$$Pc(Ac)\cdot(Bc(e)-Bc(s))=Tref \qquad \text{(equation 0)}$$

According to a simplified embodiment, value Ac is determined empirically or by an iterative process involving a reference path.

In a preliminary phase, a code value Ar as well as an initial code value Br(s) corresponding to a delay Tr(s) equal to minimum reference delay Ts is arbitrarily set on the reference path side. A full swing code value FSC, that is, a dynamic range of variation of code B between the identified future values Bc(s) and Bc(e), such as FSC=Bc(e)−Bc(s), is also selected.

The minimum delay value Ts, corresponding to the initial code value Br(s), is selected to be relatively small, but however greater than the above-mentioned minimum value limiting the linearity area.

Figure 5B:
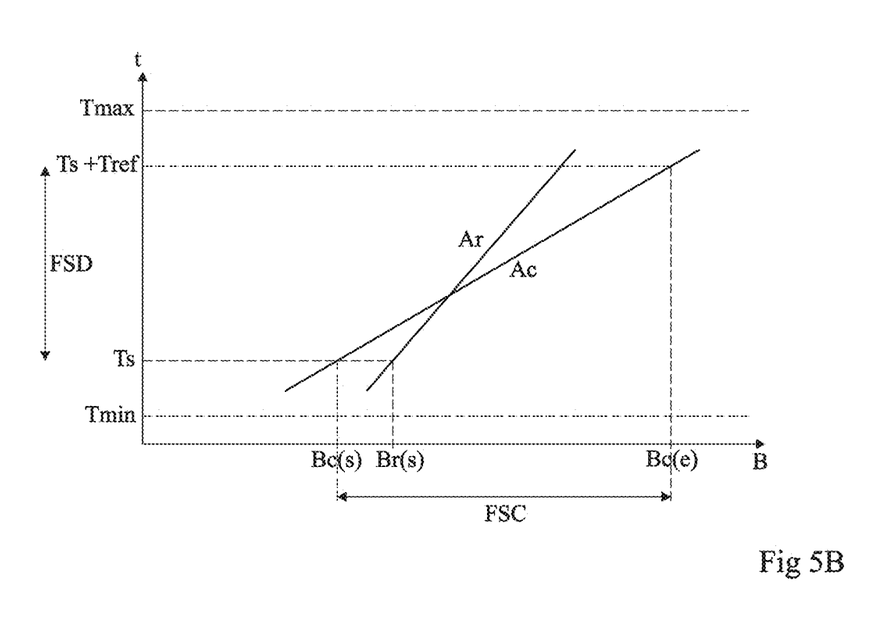

FIG. 5B illustrates the delays obtained for different code values B, according to the code values A of the path to be calibrated and of the reference path. The shown curve of the path to be calibrated corresponds to the code value Ac which is searched for and which fulfills the above-mentioned criteria.

Figure 7A:
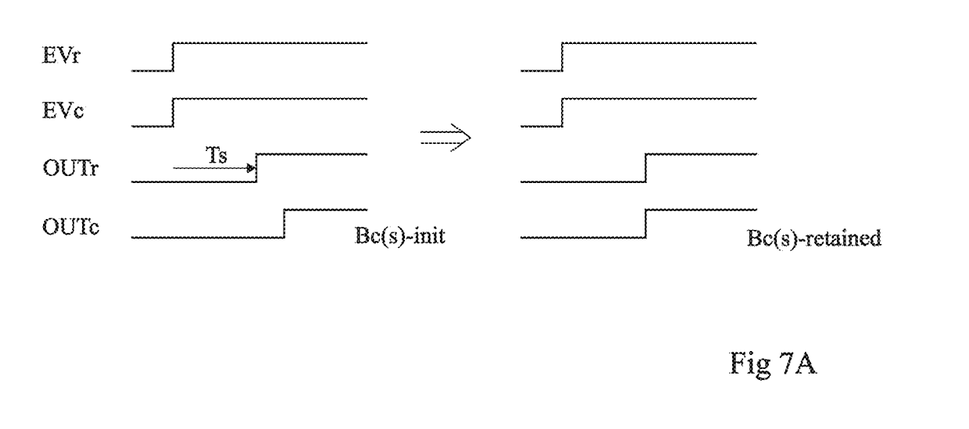
Figure 7B:
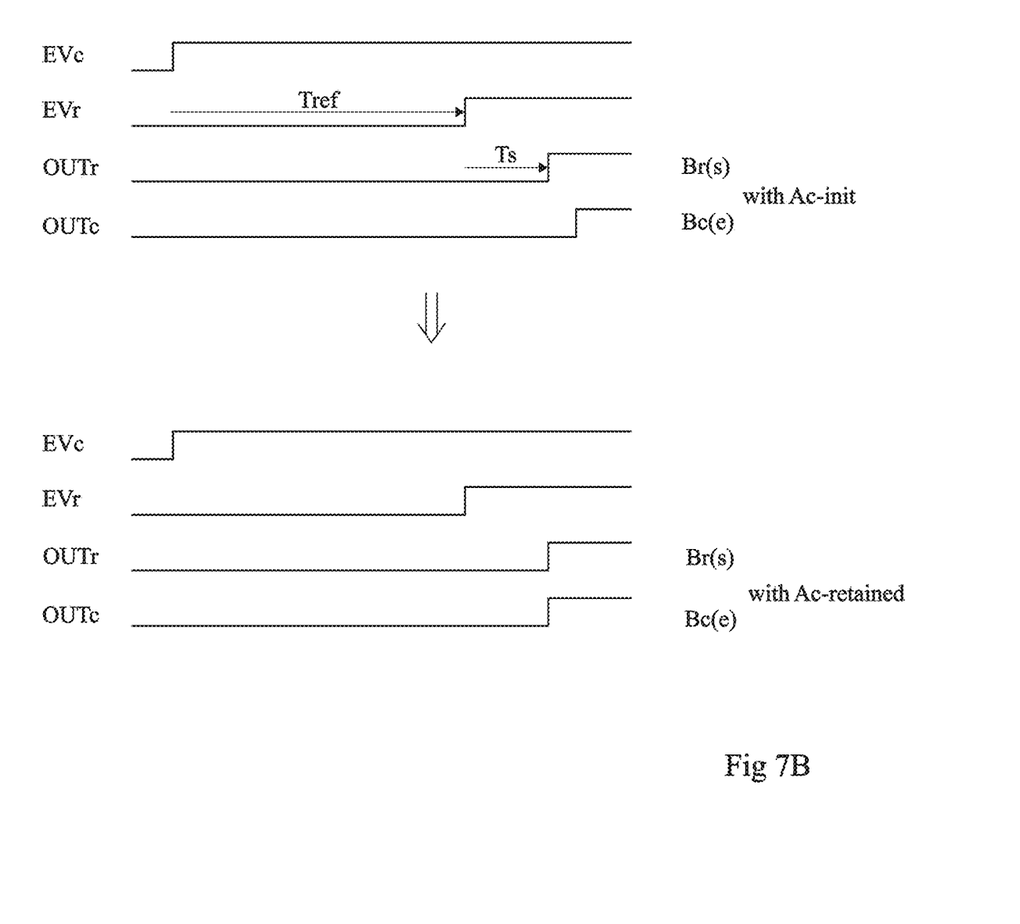

FIGS. 7A and 7B respectively illustrate a first and a second phase of an example of a method of searching for code Ac and values Bc(s) and Bc(e) such as defined hereabove and shown in FIG. 5B.

In a first phase, code Ac is initialized to an initial value (Ac-init), for example, randomly selected, and it is searched for the code Bc(s) which fulfills the following condition (equation 1):

$$Tc(Bc(s),Ac)=Tr(Br(s),Ar)=Ts \qquad \text{(equation 1)}$$

or:

$$Tc(0)+Bc(s)\cdot Pc(Ac)=Tr(0)+Br(s)\cdot Pr(Ar)$$

To find the code Bc(s) which fulfills this condition, successive tests may be performed on codes B. Thus, FIG. 7A shows on its left-hand side a first test with a first code Bc(s)-init. For this first test, it can be seen that the delays of paths c (to be calibrated) and r (reference) are different and that equation 1 is not respected. An n-th test of code Bc(s) is represented on the right-hand side of FIG. 7A, and it enables to establish the code Bc(s)-retained for this first path which enables to verify equation 1, since it can be seen that the delays on the two paths c and r are identical and equal to Ts.

In a second phase, the final code Bc(e) of path c to be calibrated is defined as being:

$$Bc(e)=Bc(s)+FSC$$

Code Bc(e) is applied to path c and the value of code Ac is varied until a delay Tc equal to delay Ts plus reference delay Tref (Tc=Ts+Tref), is obtained. Delay Tref for example corresponds to a period of a reference clock HREF.

The following equation 2 is then obtained:

$$Tc(0)+Bc(e)\cdot Pc(Ac)=Ts+Tref \quad \text{(equation 2)}$$

To find the code Ac which fulfills this condition, successive tests may be performed on codes Ac by driving paths c and r differently (conversely to the first phase). A code Br(s) (enabling to generate the minimum reference delay Ts), an unchanged code Ar, and a trigger signal EVr delayed with respect to signal EVc, are applied to reference path r, with a delay equal to reference delay Tref. A signal equivalent to a delay, of duration Ts+Tref, between the enabling of signal EVc and the state change edge of the output of signal OUTr, is thus generated at the output of path r.

On the path to be calibrated code Bc(e) (=Bc(s)+FSC) is applied and a code Ac initially corresponding to the code Ac-init used in the first phase is applied. The times of occurrence of the edges on the output signals of paths c and r are then compared to know whether the current code Ac enables to obtain the desired delay Tc. The order of occurrence of the edges enables to know whether Ac should be increased or decreased to converge towards the code Ac providing the desired delay (equal to Ts+Tref).

Thus, FIG. 7B shows at its top a first test with first code Ac-init. For this first test, it can be seen that the delays of paths c (to be calibrated) and r (reference) are different and that equation 2 is not respected. An n-th test of code Ac is shown at the bottom, and it enables to establish the code Ac-retained for the second phase, which enables to verify equation 2, since it can be seen that the delays on the two paths c and r are identical and equal to Ts+Tref.

It should be noted that the curves, more particularly the linear approximations of the delay curves according to codes B, differ in terms of slope and of ordinate at the origin, according to the code A applied to the delay generator. Thus, if the curves are relatively scattered, the delay on the path to be calibrated obtained with the code Bc(s) defined in the first phase risks differing from minimum reference delay Ts. In this case, the above-mentioned equation 0 corresponding to the final calibration purpose is thus perhaps not immediately verified. Thus, to succeed in finding the code Bc(s) and the code Ac enabling to verify equation 0 at best, the above first phase and second phase are manually or automatically repeated until the above equation is respected at best, by adjusting Bc(s) for each new value Ac which is tested. One then obtains:

$$Tref=Pc(Ac)\cdot FSC$$

According to an embodiment, advantage is taken of the architecture of the electronic circuit with a plurality of programmable delay paths such as illustrated by FIG. 6 to perform an automatic calibration.

According to this embodiment, the circuit of FIG. 6 further comprises a calibration control unit 9 (CTRL) delivering, to the different paths of circuit 1:
 code B;
 code A; and
 a control signal EV. Signal EV actually corresponds to an end-of-reset pulse, that is, of signal RESET to trigger a new delay, that is, a falling edge enabling to restart the delay generation.

Control unit 9 receives a reference clock HREF, that is, a periodic signal of period Tref.

Further, control unit 9 receives, at each measurement, information SCP representative, between two edges of the output signals corresponding to delays, of that of the edges which is ahead (or delayed) with respect to the other. This information is delivered by a phase comparator 92 (PHASE COMP) which, after each triggering by an enable signal EN, determines the output OUT which switches first. In practice, and as will be seen hereafter, since the calibration is performed on one path with respect to another, phase comparator 92 only uses two of its inputs at a time. The two selected paths are indicated by control unit 9 to phase comparator 92 by a selection signal SEL. In the following description, the following convention is taken, if the first selected path triggers an edge before the second selected path, signal SCP takes value 1, and conversely.

The calibration is iteratively performed for different values Ac, to converge towards desired initial value Bc(s) and full swing values FSD and FSC.

Such an iterative determination is for example performed by using a binary value NMES stored in a register NMES of circuit 9 and conditioning the periodicity of resets, that is, of the pulses of signals EVc (k=c) and EVr (k=r). A signal HMES of period Tref*(2^NMES) synchronous with the rising edge of HREF, where NMES represents the division factor of reference clock signal HREF, is generated from clock signal HREF of period Tref. The periodicity of the measurements, adjusted with NMES, is adapted to the time necessary for circuit 9 to perform all the operations that it has to execute. As will be understood hereafter, the measurement should last for at least 2 periods Tref, when code Ac is being estimated, and in practice the number of periods Tref for a measurement will probably be higher to be able to perform the calculations, and number NMES will be all the higher as period Tref is short—which would be the case if a generator of very short delays is desired to be formed, for which the present invention is particularly well adapted.

In a first phase (phase 1), the following conditions are applied to the inputs of paths c and r to generate delays on the respective outputs OUTc and OUTr:
 Ac
 Ar
 Bc=Bc(s)
 Br=Br(s)=Ts
 EVc=EVr=HMES Further, phase comparator 92 selects, with the adequate signal SEL delivered by control unit 9, the signals of these paths to perform the comparison.

The same measurement (codes A and B unchanged) is repeated a plurality of times to make the result of the measurement reliable (notion of redundancy). For this purpose, a register RMES is used.

Register RMES is Initialized at '0'.

At each rising edge of signal HMES, an acquisition of phase comparator 92 is triggered by enabling signal EN. If the output result SCP of phase comparator is 1, the value contained in register RMES is incremented by 1. Otherwise, the value is left unchanged. These three steps (delay generation, comparison, incrementation or not of the register) are repeated 2^NRM times, NRM being the number of times that the measurements are repeated.

At the end of the iterations, the content of register RMES is analyzed as follows: if code BC(s) is such that the delays on the two paths are equal to Ts, then, one time in two in average, value 1 is obtained on signal SCP (the content of register RMES then takes a median value in the order of 2^(NRM−1)). If the delay associated with Bc is distant from delay Ts, a large or a very small number of values equal to 1 is obtained in the successive comparisons or conversely, and the content of register RMES diverges from the median value.

The analysis of RMES enables to modify the code Bc of path c for a new burst of measurements. Successive iterations are thus performed to obtain a value Bc(s)-retained such that the content of register RMES is in the order of $2^{\wedge}(NRM-1)$.

In a second phase (phase 2), called full swing phase, a signal HMES of period Tref*(2^NMES) synchronous with the rising edge of signal HREF is always generated from signal HREF. A signal HMESD, delayed by a period of signal HREF with respect to HMES, is also generated from HMES. Then, the following conditions are applied to the inputs of paths c and r to generate delays on the respective outputs OUTc and OUTr:

Ac
Ar
Bc=Bc(s)-retained
Br=Br(s)
EVc=HMES
EVr=HMESD

Phase comparator 92 always selects the signals of these same paths to perform the comparison.

The same measurement (codes A and B unchanged) is repeated a plurality of times to make the result of the measurement reliable (notion of redundancy). For this purpose, register RMES is used as previously.

Register RMES is initialized to 0. The value Bc(s)-retained in register Bc of path c is applied. Then, Bc(e)= Bc(s)-retained+FSC is calculated.

At each rising edge of signal HMES, an acquisition of phase comparator 92 is triggered by enabling signal EN. As previously, if the output result SCP of phase comparator is 1, the value contained in register RMES is incremented by 1. Otherwise, the value is left unchanged. This operation is repeated 2^NRM times.

The content of register RMES is then analyzed according to the following procedure: if code Ac is such that the delays on the 2 paths are equal to Ts+Tref, then one time in two in average, value 1 is obtained on signal SCP (the content of register RMES then takes a median value in the order of $2^{\wedge}(NRM-1)$). If the delay associated with Ac is distant from delay Ts+Tref, a large or a very small number of values equal to 1 is obtained in the successive comparisons or conversely, and the content of register RMES diverges from the median value.

The analysis of RMES enables to modify code Ac for a new burst of measurements. Successive iterations are thus performed so that the content of register RMES is in the order of $2^{\wedge}(NRM-1)$.

The sequence of phases 1 and 2 described hereabove is preferably carried out for each value of code Ac. Thus, for each new tested value of code Ac, a possible new code Bc(s) is determined by restarting a phase 1; and then, once the new identified code Bc(s) (corresponding to a delay Ts), a phase 2 is restarted to verify whether the new code Ac enables to verify the above-mentioned equation 0.

The above-described calibration phases may be automatically implemented by the programming of circuit 9 so that it respects the described sequencing.

It should be noted that the sequencing of the operations described hereafter, particularly the sequence of phases 1 and 2, may be performed in a different order. It could for example be provided to perform different iterations of phase 2, for different values of codes Ac, without each time searching for a code Bc(s) according to phase 1. The sequence of phases 1 and 2 enabling to converge at best, the most rapidly, particularly depends on the dispersion of the linear approximations of the delay curves according to the codes B and A applied to the delay generator. An advantage of the described embodiments is that a particularly reliable programmable electronic delay generation circuit, enabling to obtain a delay increment in constant code steps (delta D/delta C=constant), corresponding to a linear variation over the full swing code range FSC, is obtained. Indeed, the fact of generating in the path to be calibrated two different delays (in the above-mentioned examples, a "short" delay Tc(Bc(s), Ac) and a "long" delay Tc(Bc(e), Ac)) and of using another path, or another circuit, to generate a short delay Ts and a long delay corresponding to the concatenation of the short delay and of another reference delay Tref, enables in practice to suppress comparison errors for example due to a measurement offset between two inputs of the comparator.

An advantage of the above-mentioned embodiments using a measurement redundancy is that they enable, in practice, to calibrate very short delays which are particularly sensitive to jitter phenomena. The redundancy of measurements enables, by the averaging, to strongly decrease the influence of the jitter, and this all the more as the number of redundant measurements is high. It should be noted that a delay generation circuit according to the present invention comprising a device of calibration of the delay selection codes is particularly adapted to the generation of short delays, with an increment step between the different delays which is also very short. As an example, it is possible to generate delays over a range from 0, or a little more than 0, to approximately 10 nanoseconds, with 10,000 selection codes, and thus with a delay increment step in the order of 1 picosecond.

In the case where a delay longer than the maximum possible delay (10 ns) is desired to be generated with the very accurate delay generation circuit, while having a very fine definition accuracy (equal to 1 ps), it is possible to cascade two, or a plurality of, delay generation circuits with different delay ranges.

It should further be noted that the calibration device according to the present invention enables to select, for a given delay generation circuit, the selection code range (codes B in the above-mentioned examples) most appropriate to provide a very good linearity on the selection code range retained in fine. In other words, the amplitude of the code range may for example be equal to 2k, k being an integer (for example, 214=16384) and only n codes are finally retained after calibration in the linearity range, n corresponding to the number of code steps desired for the application using the delay generation circuit (in the above-mentioned example, n=10,000).

Another advantage of the described embodiments is that the calibration of the delay generation circuits is particularly simple. In particular, whatever the parameters of the reference path, provided to respect the described steps, a path to be calibrated may be calibrated with any reference path. Thus, the different paths may be calibrated with respect to a same reference path or with respect to one another. This is possible due to the use of a reference delay Tref, for example provided by a reference clock. The calibration result will be all the more reliable as the reference delay will be accurate, particularly with "steep" edges with a very small offset from one cycle to the other (in all cases, an offset smaller than the desired accuracy, for example, 1 ps in the above-mentioned example).

It should be noted that the calibration may be perform otherwise than between two paths, for example, by using a circuit generating a short delay Ts in phase 1 and generating a long delay Ts+Tref in phase 2, with, preferably, a concatenation of two delays for the generation of the long delay (see the above reliability advantage). However, in the case where a plurality of delay generation paths are present in the circuit, the additional circuit is not necessary and another path is advantageously used as a reference path. In the case where the delay generation circuit comprises a plurality of paths, all calibrated with respect to one another according to an iterative process, an identical minimum delay and maximum delay corresponding to FSD will be obtained, with Ts corresponding in practice to the initial delay Tr(s) of the first path selected as a reference. To generate delays on a same delay range, FSD, the different paths may have different retained selection code ranges (with a setting of code A and a minimum code of range Bc(s) which may be different).

Further, in all the previously-described examples, the selection code used in fine after the calibration to select the desired delay corresponds to code B, that is, to the code, which controls the value of the threshold voltage V13 of comparator 12 (FIG. 3). According to other alternative embodiments, it is possible to use code A, that is, the code which controls the charge current I2 of capacitor Cc, to perform a selection of the desired delay. In this case, during the calibration method, the range of codes A enabling, after the determination of the best code value B for the linearity, to obtain the desired delay range, should be searched for. Thus, in search phase 2, the comparison threshold should be varied (comparator 12) instead of varying the charge slope of capacitor Cc. It will be within the abilities of those skilled in the art to adapt the above-mentioned calibration method to this possibility of delay selection by code A, instead of code B.

The code A, or B, retained after the calibration method is advantageously stored in a register having its output coupled to the control inputs of the associated digital converter to permanently apply, in a phase of use of the delay generation circuit, the same predefined code during the calibration phase.

Further, in the above-mentioned examples, the interval between being only desired to verify whether the delays are equal (verified median value) or whether the delays differ. According to an alternative embodiment, it may be provided to analyze the amplitude of the interval between the delays and to use this analysis to determine which future code test to perform.

Further, in the above-mentioned examples, the first calibration phase aims at finding a code Bc(s) corresponding to the smallest code value in the desired code range, the largest code value in this range being defined from full swing code range FSC; and the second calibration phase aims at finding a code Ac corresponding to the charge slope of capacitor Cc. As a variation, the second calibration phase (with a large delay equal to Ts+Tref) might be used to identify the largest code value in the desired code range, the smallest code value in this range being then defined from full swing code range FSC (by a subtraction instead of an addition); and the first calibration phase (with a short delay equal to Ts) might be used to identify the code Ac corresponding to the slope.

Further, the determination of the different values to be given to the components of the delay generation circuit depends on the application. These values may be determined by application of the described formulas, and then refined empirically or by tests.

Various embodiments and variations have been described. These various embodiments and variations may be combined and other variations will occur to those skilled in the art. In particular, the determination of the different values and the sizing of the components depends on the application and is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of calibrating a delay generation circuit, the circuit comprising:
   a capacitive element of integration of a first current supplied by a first current source, wherein the first current source comprises a first digital-to-analog converter controlled by a first digital control code;
   a circuit of initialization of the capacitive element on order of an initialization signal;
   a comparator of a first charge voltage of said capacitive element with respect to a second voltage, said second voltage being generated from a second digital-to-analog converter controlled by a second digital control code, the comparator having a comparison output delivering an output signal having a desired delay with respect to the initialization signal; and
   wherein, during a phase of use of the delay generation circuit, only one code, called selection code, among the first and second digital control codes is used to select the desired delay, the other control code, called adjustment code, remaining at a predefined value; and
   wherein, during a phase of calibration of the delay generation circuit, the first and second digital control codes are used to defined said predefined value and the comparison output is coupled to an input of a phase comparator; and
   wherein the calibration method comprises the steps of:
      in a first test phase:
         a1) applying a first set of first and second digital control codes and applying an initialization signal;
         b1) delivering, on another input of the phase comparator, a calibration signal having a first reference delay with respect to the initialization signal;
         c1) analyzing the output signal of the phase comparator; and
      in a second test phase:
         a2) applying a second set of first and second digital control codes and applying an initialization signal;
         b2) delivering, on said other input of the comparator, a calibration signal having a delay equal to the sum of the first reference delay and of a second reference delay;
         c2) analyzing the output signal of the phase comparator.

2. The method of claim 1, wherein the first and second test phases are repeated a plurality of times by changing the first and second sets of first and second digital control codes, to identify said predefined value of the adjustment code.

3. The method of claim 1, wherein the first test phase is repeated by changing the value of a same code from among the selection code and the adjustment code, and wherein the second test phase is repeated by changing the value of the other code.

4. The method of claim 1, wherein a same test phase, the first and/or the second one, is repeated a plurality of times for a same set of digital control codes, the successive values of the output comparison signal being analyzed together to determine whether the applied set of digital codes enables or not to obtain a delay substantially equal, according to the test phase, to the first reference delay or to the sum of the first and second reference delays.

5. The method of claim 3, wherein, during the test phase, optionally repeated by changing the value of the selection code, a first limiting value of the selection code is searched for and wherein a second limiting value of the selection code is defined from the first limiting value and from a number of codes corresponding to a desired full swing code range; and wherein, during the other test phase, optionally repeated by changing the value of the adjustment code, the value of the selection code used corresponds to the previously-defined second limiting value of the selection code.

6. The method of claim 1, wherein the second reference delay corresponds to a desired full swing delay range for which the curve representing the delay obtained according to the selection code value, for a given adjustment code value, is substantially linear.

7. The calibration method of claim 1, using a second delay generation circuit identical to said delay generation circuit, wherein, during steps b1) and b2), the second delay generation circuit is used to generate said calibration signal at the input of the comparator, the initialization signal of the second delay generation circuit being respectively synchronous with the initialization signal of the first delay generation circuit or delayed by a delay equal to the second reference delay.

8. A circuit comprising a delay generation circuit, comprising:
- a capacitive element of integration of a first current supplied by a first current source, wherein the first current source comprises a first digital-to-analog converter controlled by a first digital control code;
- a circuit of initialization of the capacitive element on order of an initialization signal;
- a comparator of a first charge voltage of said capacitive element with respect to a second voltage, said second voltage being generated from a second digital-to-analog converter controlled by a second digital control code, the comparator having a comparison output delivering an output signal having a desired delay with respect to the initialization signal; and
- wherein, during a phase of use of the delay generation circuit, only one code, called selection code, among the first and second digital control codes is used to select the desired delay, the other control code, called adjustment code, remaining at a predefined value; and wherein, during a phase of calibration of the delay generation circuit, the first and second digital control codes, as well as the initialization signal, are controlled by a calibration device, and the output signal is received by the calibration device, to define said predefined value of the adjustment code by implementing the calibration method of claim 1.

9. The circuit of claim 7, comprising a delay calibration circuit coupled to the delay generation circuit, the calibration circuit comprising a phase comparator receiving on an input said output signal of the delay generation circuit and on another input a calibration signal, the calibration circuit implementing, in a calibration phase prior to the phase of use, the calibration method of claim 1.

10. The circuit of claim 8, wherein the second reference delay corresponds to a period of a reference clock signal, optionally generated by a clock generation device of the circuit.

11. The circuit of claim 8, comprising a plurality of identical delay generation circuits, a second delay generation circuit being used to implement the calibration method on a first delay generation circuit, by implementing the calibration method of claim 7.

\* \* \* \* \*